United States Patent
Quader et al.

(10) Patent No.: US 6,285,615 B1
(45) Date of Patent: Sep. 4, 2001

(54) MULTIPLE OUTPUT CURRENT MIRROR WITH IMPROVED ACCURACY

(75) Inventors: Khandker N. Quader, Sunnyvale; Sharon Y. Huynh, Cupertino, both of CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/592,469

(22) Filed: Jun. 9, 2000

(51) Int. Cl.⁷ ..................................................... G11C 7/02
(52) U.S. Cl. ...................................... 365/208; 365/185.21
(58) Field of Search .................................. 365/208, 210, 365/185.21, 185.2; 327/53, 538, 543; 323/312, 323

(56) References Cited

U.S. PATENT DOCUMENTS

| | | | |
|---|---|---|---|
| 5,163,021 | * 11/1992 | Mehrotra et al. | ..................... 365/185 |
| 5,172,338 | 12/1992 | Mehrotra et al. | ..................... 365/185 |
| 5,487,045 | * 1/1996 | Trodden | ................................ 365/205 |
| 5,621,686 | 4/1997 | Alexis | .............................. 365/185.21 |
| 5,627,732 | 5/1997 | Loh et al. | ............................... 363/16 |
| 6,147,550 | * 11/2000 | Holloway | ............................. 327/544 |
| 6,166,590 | * 12/2000 | Friedman et al. | .................... 327/543 |

OTHER PUBLICATIONS

Thissen, Ph. et al. (1994) "Matching Properties of CMOS SOI Transistor" Proceedings of the 4th International Conference on Microelectronics of Neural Networks and Fuzzy Systems, pp. 134–137 month unavailable.

Vittoz, E. (1983) "MOS Transistors Operated in the Lateral Bipolar Mode and Their Application in CMOS Technology" *IEEE Journal of Solid–State Circuits* SC–18(3):273–279 Jun. 1983.

\* cited by examiner

Primary Examiner—Richard Elms
Assistant Examiner—Anh Phung
(74) Attorney, Agent, or Firm—Skjerven Morrill MacPherson LLP

(57) ABSTRACT

A multiple output current mirror of improved accuracy suitable for use in a multi-level memory or analog applications is described. A reference current is mirrored in number of branches to produce replicas of the original current without degrading the original current. Both the mirrored transistor, through which the original current flows, and the mirroring transistors, which provide the replicated currents in each of the branches, are subdivided into a number of separate transistors. The effective channel width of a corresponding original transistor is shared among the transistors forming its subdivision. These subdivided elements are then physically arranged into a number partial current mirrors whose outputs are combined to form the total current mirror. By altering the physical arrangement of the pieces from one partial mirror to the next, variations in operating characteristics and manufacturing processes that are dependent upon positions are reduced since the variation in one partial mirror offsets that in another partial mirror. In an exemplary embodiment, the mirrored element, producing the reference current, and the mirroring elements in each of k branches are each composed of N transistors with a width w, giving an effective width W=Nw for each element and consequently a mirroring ration of 1 for all the branches. All of these N(k+1) transistors are physical placed in a linear arrangement of N partial current mirrors of (k+1) transistors each, where each partial mirror contains a transistor supplying part of the mirrored current and one transistor from each of the k branches mirroring it. Each of the N partial mirrors has its (k+1) elements arranged in a different permutation. The N=5, k=3 case is described in some detail.

10 Claims, 3 Drawing Sheets

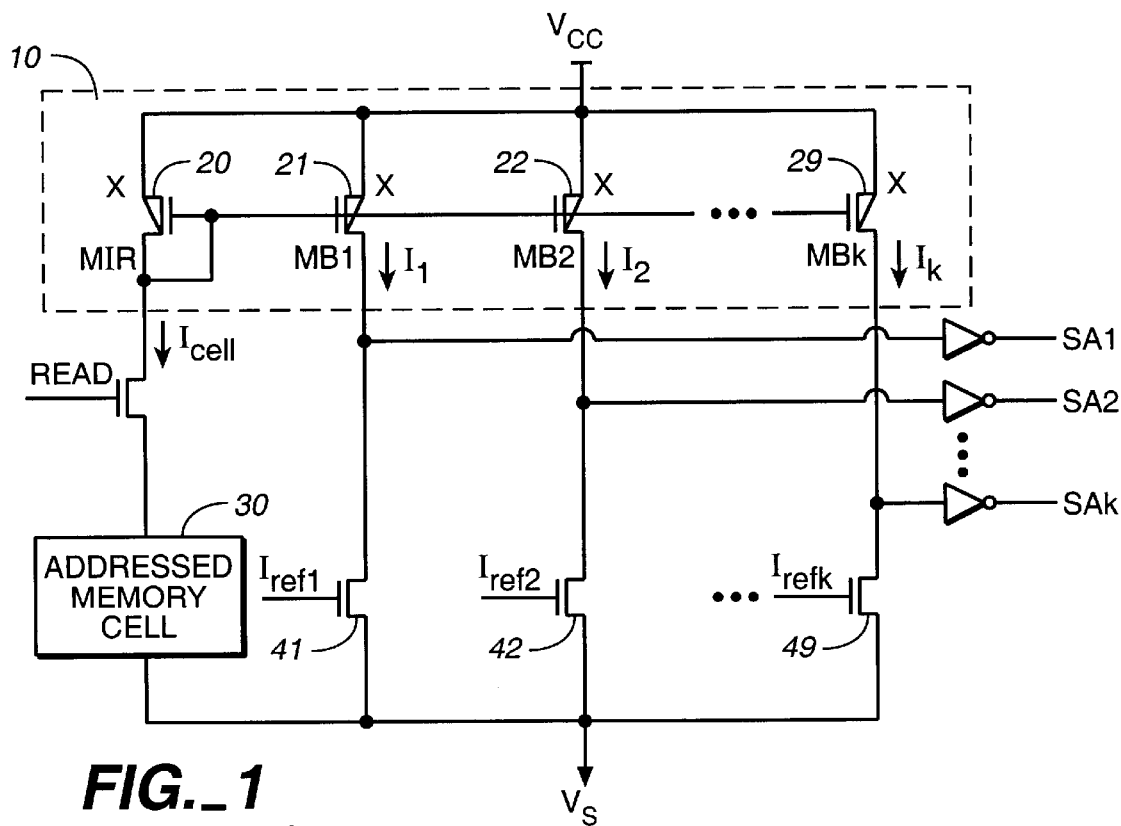
FIG._1
*(PRIOR ART)*
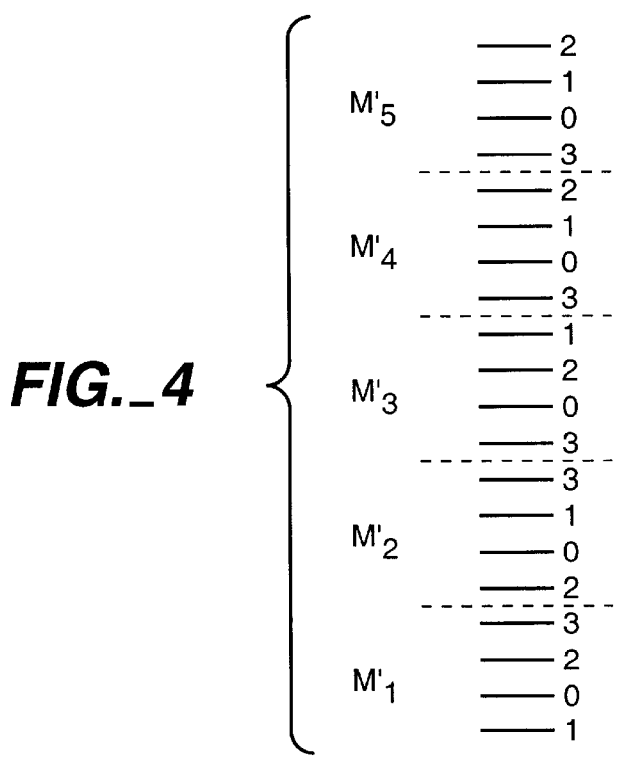
FIG._4

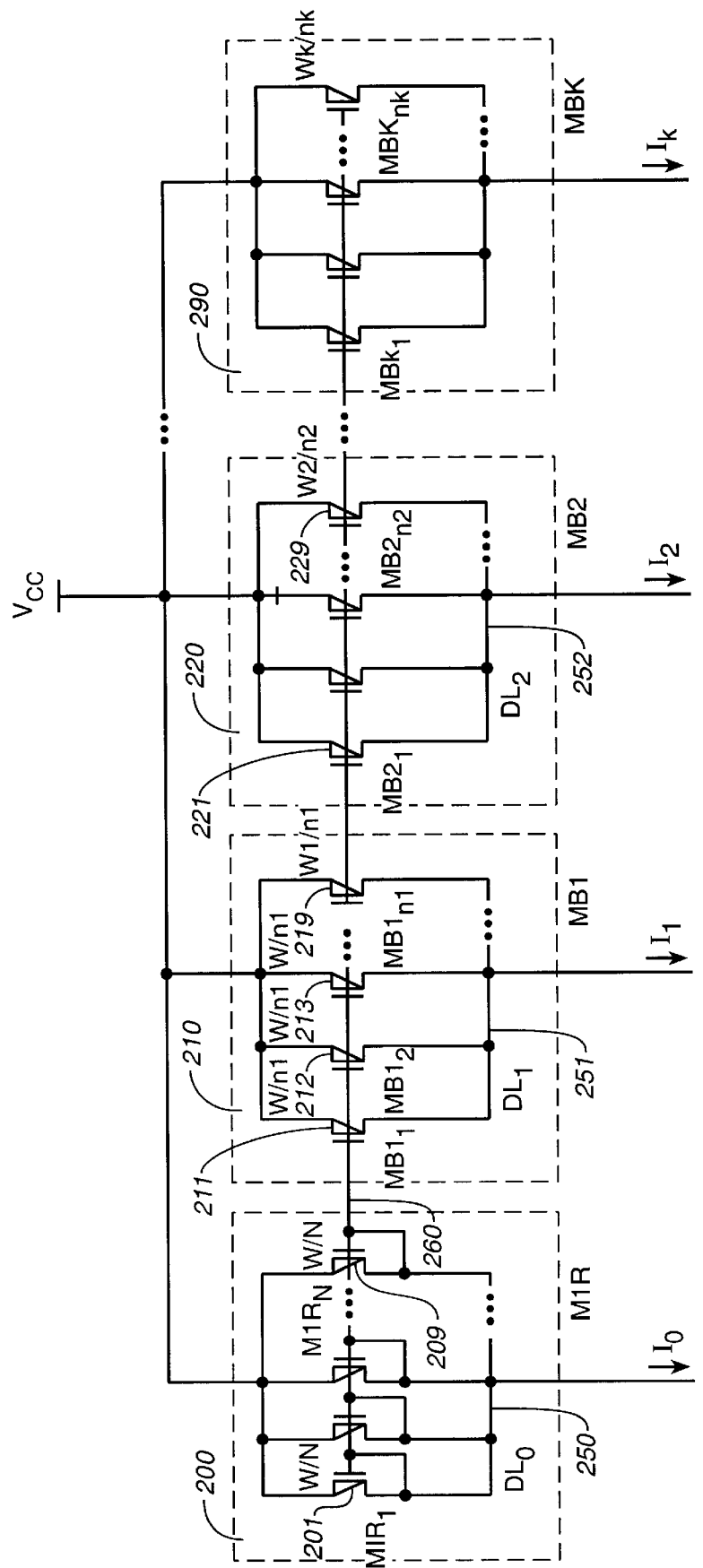
FIG._2

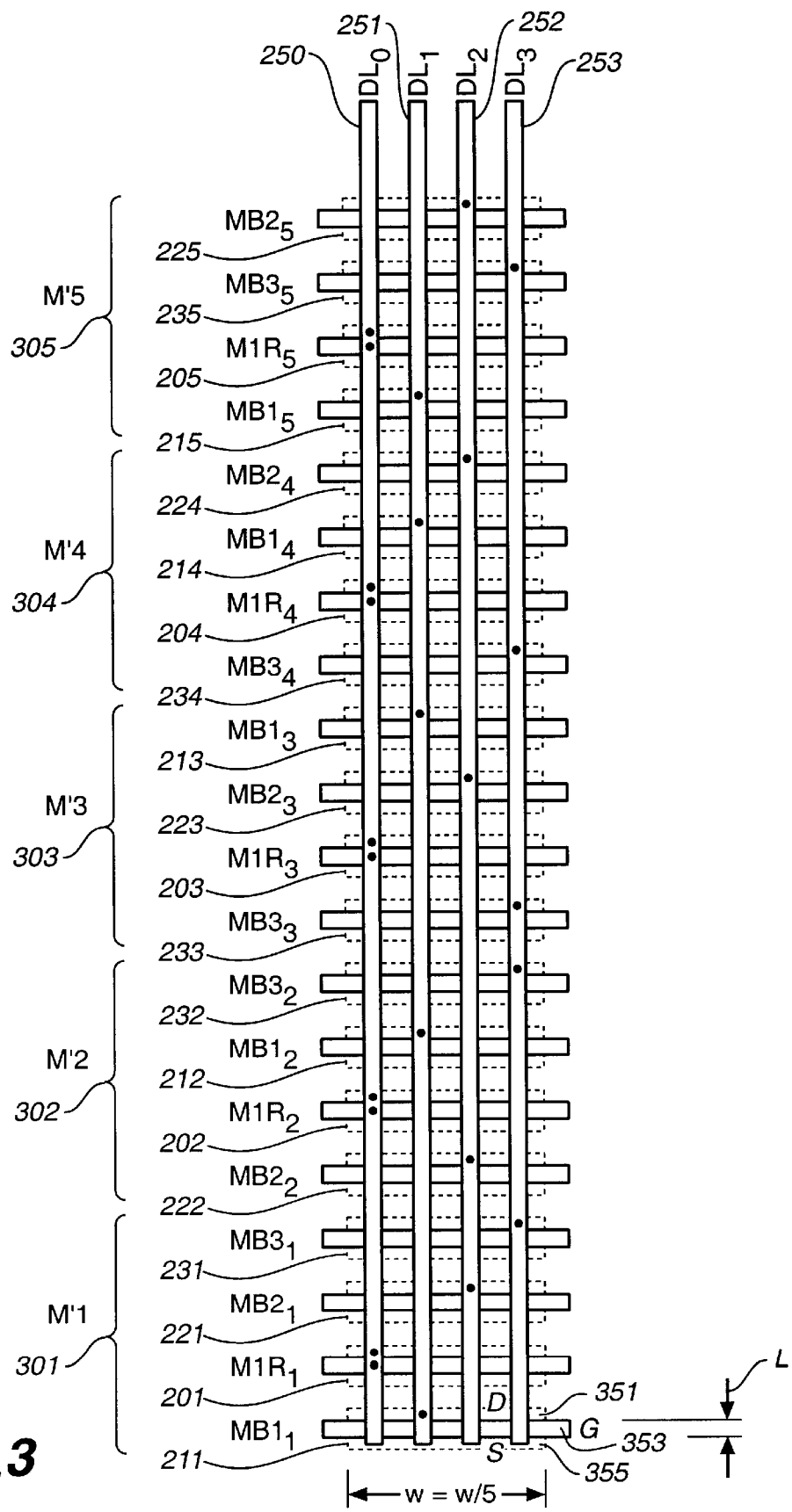
FIG._3

MULTIPLE OUTPUT CURRENT MIRROR WITH IMPROVED ACCURACY

BACKGROUND OF THE INVENTION

1. Field of the Invention

The present invention relates generally to current mirrors and, more particularly, to multiple output current mirrors with improved accuracy.

2. Background Information

Current mirrors are a basic building block of many circuits and allow a given current flowing in one element to be replicated in another element. The accuracy of the mirror is determined by how closely the level of the original current, or a predetermined multiple of it, is reproduced. In a multiple output current mirror, more than one copy of the original current is provided as output.

One example of a prior art multiple output current mirror is shown in FIG. 1, where it finds application in the reading of a multi-level memory cell. In this arrangement, during a read operation a current $I_{cell}$ flows through the addressed cell 30. The level of this current flow depends on which of (k+1) states the memory cell is in. To determine this state, the current is reproduced k times in current mirror 10 to produce currents $I_1, I_2, \ldots, I_k$. One of a series of transistors 41, 42, ..., 49 is then placed to received the respective current, each being controlled by a respective reference value $I_{ref1}$, $I_{ref2}, \ldots, I_{refk}$, thereby acting as a series of reference circuits to sense the value of $I_{cell}$ relative to the $I_{ref}$S. This allows the k currents $I_i$; to be compared with the k reference levels, the result being determined by the k sense amps SAi. The circuit of FIG. 1 is adapted from U.S. Pat. No. 5,172,338, which is hereby expressly incorporated herein by this reference, where it and a number of variations are described in more detail. The particular details of these peripheral portions of FIG. 1 are not particularly important here except to provide a context for the multiple output current mirror 10. The relevant property of current mirror 10 is that it provides accurate values of the currents $I_1$–$I_k$ without degrading the original reference current, here $I_{cell}$.

Current mirror 10 is a one-to-k arrangement, with a first transistor 20 on a first leg and a set of k second transistors 21, 22, ..., 29 on each branch of a second leg. When a current $I_{cell}$ flows in the first leg, the second transistor on each branch of the second leg behaves as a current source and supplies a reproduced current in its branch. The ratio of the reproduced currents to the original currents scales according to the relative sizes of the second transistors 21, 22, ..., 29 to the first transistor 20. In FIG. 1, all of the transistors of current mirror 10 are shown with the same size, denoted by the symbol "X". This results in a one-to-k current mirror in which the first current is reproduced in all the branches of the second leg, ideally with $I_{cell}=I_1=I_2=\ldots=I_k$ and without dilution of $I_{cell}$. A more general set of current ratios can be set by the usual method of altering the relative width to length ratios of branches as described in more detail in the patent cited in the previous paragraph.

In practice, the results are less than ideal for a number of reasons. The above discussion assumes that all of the transistors can be manufactured to the desired dimensions and are independent of process variations. It also assumes that the transistors all function ideally, or at least function the same, independent of temperature gradients and other variations on the surface of the circuit that will give operating characteristics differing from the physical location of one transistor to the next. Additionally, it is assumed that the same voltage that is applied to the control gate of the mirrored transistor 20 is also applied to the control gate of each of the mirroring transistors 21, 22, ..., 29 with out any loss between, say, transistor 21 of the first branch and transistor 29 of the k-th branch. As the development of integrated circuits has progressed, design requirements, such as smaller size and lower operating voltages, have aggravated these problems.

As the response of a transistor depends upon the ratio of its width to its length, one way to improve accuracy is to increase its size in one or both dimensions so that the relative effect of a size variation in either dimension is minimized. Conversely, as device sizes have decreased, these relative dimensional variations result in larger device to device variations in device characteristics. In the application of FIG. 1, for example, it is common that the transistor size is determined by the pitch size of the memory cells. This effectively limits the width of the mirror transistors to the width of the group of transistors to be sensed together. In such an arrangement, the width of the mirror transistors could be increased by increasing the pitch size, but many factors go into deciding pitch size, with the width of the current mirror transistors only one, and often a lesser one, of these. The length of the transistors is not so restricted, but any increase in length leads to a larger die size and also results is any position dependent variations, either operational or process, being amplified.

With a multiple output current mirror, some of the transistors 20–29 are of necessity further from a given one than others, so that process variations result in less accurate mirroring as the number of legs increases. This physical separation also makes the multiple output current mirror more susceptible to temperature gradients and other variations in operating conditions on the circuit. Similarly, the further a given mirroring transistor is from the mirrored transistor, the more the voltages on their respective control gates will differ due to losses from the intervening transistors in other legs as well as other losses along the way.

As the operating voltages of devices become lower, the current levels have correspondingly decreased, so that the acceptable variations between the different mirroring $I_i$S and the original mirrored reference current have become more critical. In the multi-level, non-volatile memory of the example, the ability to mass produce accurate memory chips depends crucially on a accurate current mirror to distinguish the states of the cells. This is also true of analog circuits where the relative variation in a replicated current needs to minimal. Therefore, an objective of the present invention is to provide a multiple output current mirror which is more accurate and less susceptible to the problems described above.

SUMMARY OF THE PRESENT INVENTION

The present invention presents a multiple output current mirror. A reference current is mirrored in number of branches to produce replicas of the original current without degrading the original current. Both the mirrored transistor, through which the original current flows, and the mirroring transistors, which provide the replicated currents in each of the branches, are subdivided into a number of separate transistors. The effective channel width of a corresponding original transistor is shared among the transistors forming its subdivision. These subdivided elements are then physically arranged into a number partial current mirrors whose outputs are combined to form the total current mirror. By altering the physical arrangement of the pieces from one partial mirror to the next, variations in operating characteristics and manufacturing processes that are dependent upon positions are reduced since the variation in one partial mirror offsets that in another partial mirror.

In one embodiment, the mirrored element, producing the reference current, and the mirroring elements in each of k branches are each composed of N transistors with a width w, giving an effective width W=Nw for each element and consequently a mirroring ration of 1, for all the branches. All of these N(k+1) transistors are physical placed in a linear arrangement of N partial current mirrors of (k+1) transistors each, where each partial mirror contains a transistor supplying part of the mirrored current and one transistor from each of the k branches mirroring it. Each of the N partial mirrors has its (k+1) elements arranged in a different permutation.

Additional objects, advantages, and features of the present invention will become apparent from the following description of its preferred embodiments, which description should be taken in conjunction with the accompanying drawings.

BRIEF DESCRIPTION OF THE DRAWINGS

FIG. 1 shows a prior art example of a multiple output current mirror in a particular application.

FIG. 2 is a schematic representation of the structure of the present invention.

FIG. 3 is a physical arrangement of an embodiment of the schematic representation from FIG. 2.

FIG. 4 is a simplified form of FIG. 3 to clarify the placement of elements found there.

DESCRIPTION OF THE PREFERRED EMBODIMENT

Several aspects of the present invention are shown in FIG. 2. FIG. 2 is meant as a schematic representation of some of the concepts involved and not to depict actual physical arrangement of the various elements on a chip, which is described below with respect to FIGS. 3 and 4. As with FIG. 1, FIG. 2 shows a one-to-k current mirror and the corresponding elements are labelled similarly. The original reference current $I_0$ again flows out element MIR 200 and is mirrored in elements MB1 210 through MBk 290 to produce respective currents $I_1$ through $I_k$. Compared to FIG. 1, however, each of the single transistors found there has been subdivided into, generically, several separate transistors.

Element 200 for FIG. 2 replaces transistor 20 of FIG. 1 with N transistors, $MIR_0$ 201 through $MIR_N$ 209, dividing the original width W between them while maintaining the channel length. Each of these transistors again has its drain connected to its gate, all of the gates again connected through line 260. In this way, each of $MIR_0$ 201 through $MIR_N$ 209 has a width W/N and supplies 1/N of the total current. The total dimensions of the combined N transistor is then the same as for transistor 20 of FIG. 1, there denoted "X", and the various sub-currents are collected on the common drain line $DL_0$ 250 to produce the total current of $I_0$. (More generally, the total width W could be divided up non-symmetrically between the $MIR_i$ and they could also have differing lengths; but neither is not done in the preferred embodiment and including these variations would further obscure the discussion below. Variations of this kind are familiar in the art and discussed more fully in U.S. Pat. No. 5,172,338 incorporated by reference above. Similarly, the discussion of the other transistors below will, aside from some specific comments, assume a common channel length.)

Similarly, element MB1 210 now is subdivided into n1 transistors $MB1_1$ 211 through $MB1_{n1}$ 219, each with their gate again connected to line 260. Its total width $W_1$ is divided between these transistors so that each has width of $W_1/n1$. The individual sub-currents through each of the $MB1_i$ is collected at drain line $DL_1$ 251 to produce the total current $I_1$ from $MB_1$ 210.

The other branches of the current mirror are subdivided in the same way. In each case, a total channel width of $W_i$ is split between ni transistors so that each has a width of $w_i=W_i/ni$. Consequently, each contributes a portion 1/ni to the total current which is collected at the drain line $DL_i$ to result in $I_i$. The relative values of the each of the mirrored currents $I_1-I_k$ with respect to both each other and the original reference current $I_0$ is determined by the respective ratios of the corresponding widths $W_1-W_k$ and $W_0$ (or, alternately, lengths). For instance, if $W_1=2W_2$ (or $L_1=\frac{1}{2}L_2$), then $I_1=2I_2$. This difference in total width can be obtained by having the same number of transistors in $MB_1$ than in $MB_2$ (n1=n2), but with each transistor in $MB_1$ twice the width of those $MB_2$. Alternately, each of the transistors in $MB_1$ and $MB_2$ could be taken to have the same size ($W_1/n1=W_2/n2$), but with twice the number in $MB_1$, so that n1 is twice n2. (Of course, both the relative numbers and sizes could both be varied in a more complicated arrangement.) Thus, although the individual transistors can all be taken the same size, the current ratios can be fixed by differing the n1–nk with respect to each other and with respect to N.

For most of the rest of the discussion, the choices of N=n1=n2= . . .=nk and W=$W_1$=$W_2$= . . . =$W_k$ will be taken as this both makes the discussion simpler and is a particularly useful embodiment. In this case, the current mirror 100 will ideally produce currents in the ratios $I_0:I_1:I_2: \ldots :I_k$=1:1:1: . . . :1. Some comments on the more general case will be given at the end.

Returning to FIG. 2 with these assumptions, further take the specific example of k=3, so that 100 is a 1-to-3 current mirror. Both the mirrored element MIR 200 and each of the mirroring elements MB1 210, MB2 220, and MB3 290 contains N transistors of width W/N. Again, FIG. 2 is a schematic representation of the circuit and not intended to represent the actual physical positioning of these transistors.

The present invention reduces many of the accuracy problems associated with multiple output current mirrors by the physical placement of the transistors. Aside from the physical placement, in manufacturing the transistors process variations will result in the transistors not all having the desired, nominal dimensions. Their actual size should follow a distribution, and the larger the number of transistor the closer the mean of this distribution should be to the nominal values and, consequently, the more accurate the mirroring. Alternately, this can be considered a way of obtaining a wider effective channel width even when the actual channel width available to a single transistor is restricted. In the memory array example of the background section, the width w of a single transistor in the current mirror is limited to the pitch size. Combining N such transistors then allows an effective channel width of n times the pitch size, W=Nw, thereby loosening the dependence of this width on the pitch size.

The transistors in FIG. 2 are physically arranged on the integrated circuit to minimize the effects due to variations in both processing and operations that are position dependent and dependent on differences in the proximity of the mirroring transistors in each of the branches MBi to the mirrored transistors in MIR 200. This is done by interleaving one of the N transistors from each of MIR 200, MB1 210, MB2 220, and MBk 290 to form a sub- or partial current mirror. This process is then repeated (N−1) more times, but in each case with the physical arrangement of the transistors in a different permutation. In this way, although a temperature gradient, say, would effect a transistor from MB1 more than that form MB2 in one partial mirror, this will be offset in another mirror where the positions of the MB1 and the MB2 transistors are reversed, thereby minimizing the resultant difference between $I_1$ and $I_2$. Similarly, variations in other position dependent operating characteristics, as well as in process flow, are smoothed out between the element MIR 200 and the mirroring branches MBi.

As a result, the total number of transistors is (k+1)N. If all different permutations are taken once, N=(k+1)? and this results in (k+1)·(k+1)? total transistors. For the k=3 example used here, this is 96 transistors. Making the current mirror as accurate as possible must be balanced with the competing objective of reducing the size and number of components in a circuit. Since the goal is to have each of the $I_i$ accurately reflect $I_0$, preferably only those arrangement which minimize the average distance between the partially mirrored element $MIR_i$ and the partial element $MB1_{i-MBki}$ from each of the branches in a given partial current mirror is chosen. Thus, if the transistors are placed on a circuit with their channels linearly placed, the element $MIR_i$, from MIR 200 will be centrally located; that is, in each sub-mirror it will be the center transistor if k is even or one of the two center transistors if k is odd, as in the example. This reduces the maximum number of permutations by a factor of (k+1) to (k+1)? with a corresponding reduction in the needed die area.

The number of permutations can be reduced further if some of the mirrored currents are considered less critical than others. This is a design decision which must balance overall accuracy against circuit size. For example, in the application to the reading of a multi-state memory cell as shown in FIG. 1, the accuracy of current $I_i$ may be more important than of $I_2$ or $I_3$. In such a circumstance, some of the permutations which de-emphasize $I_1$ may be omitted to reduce the amount of peripheral elements on the memory chip and a less than maximal number of partially current mirrors used.

FIG. 3 shows a physical arrangement of a current mirror using such a less than the maximal number of permutations. The five transistors of MIR 200 and each of the three branches MB1 210, MB2 220, and MB3 290 are placed linearly into five groups of four, each group having a transistor $MIR_i$ providing part of the reference current $I_0$ in a central position with one transistor from each of the mirroring branches completing the group. FIG. 4 is a simplified version of FIG. 3 just to indicate this arrangement without the detail. Note that the a sixth possible permutation (1-3-0-2, reading from the top) which would keep the transistor from MIR 200 in the same position is absent, de-emphasizing $I_2$ and $I_3$ relative to $I_1$.

The twenty transistors of FIG. 3 are arranged linearly into five partial current mirrors $M'_1$–$M'_5$ 301–305 each having four transistors. Each transistor has a diffusion region indicated by the ghosted rectangle. Over this is placed the control gate, indicated by the horizontal solid bar, below which is formed the channel. These regions are labelled for the bottom transistor $MB1_1$ 211, with the control gate G 353 defining the channel between source S 355 and drain 351. These regions are the same on the other devices, but are unlabeled to simply the picture. As usual, which is the sources and drains could be reversed on any or all of the devices as these are defined by their connections. The channel length is indicated by L and the width of a single transistor indicated by w=W/5, giving an total effective channel width of W for MIR 200 and each of the branches MBi.

Looking at partial mirror $M'_1$ 301, this is made up of(from the top) $MB3_1$ 231, $MB2_1$ 221, $MIR_1$ 201, and $MB1_1$ 211. As $MIR_1$ 201 is centrally located, it is equidistant from both $MB2_1$ 221 and $MB1_1$ 211. If there is, say, a temperature gradient running from the bottom of the FIG. 3 to the top, $MB2_1$ 221 and $MB1_1$ 211 will operate differently from both each other and $MIR_1$ 201. This effect is reversed in the mirror $M'_2$ 302 immediately above, where the positions of the corresponding elements from MB1 and MB2 are reversed. Thus, when the various sub-currents are summed, the difference between $I_1$ and $I_2$ due to the gradient is reduced. Similarly, other variations in either operating conditions or processing conditions which are position dependent are ameliorated. Similar variations in accuracy for the sub-currents making up $I_3$ are reduced in the other permutations of $M'_3$–$M'_5$ 303–305. FIG. 4 gives a schematic representation of these permutations without the detail of FIG. 3, where "0" refers to a sub-element of MIR and "i" refers to a sub-element of MBi. Again, it should be noted that in this embodiment, a possible sixth permutation $M'^6$ is omitted to show that an embodiment which is less than maximal can be used to save space at the expense of lower accuracy for, in this example, $I_2$ and $I_3$.

The partial or sub-currents which form each of the partial mirrors are then collected by the drain lines $DL_0$–$DL_3$ 250–253 running vertically. The connections to the corresponding drains are indicated by the dots. The drain line for the reference current $DL_0$ 250 also has a second dot for the gates of $MIR_1$–$MIR_5$ 201–205 to be connected to their respective drains. To simply FIG. 3, two additional connections have been suppressed: all of the gates are tied together, as shown in FIG. 2 by line 260 and which could be done by running another line parallel to the $DL_i$ with a connection dropped down to each gate, and all of the sources need to be connected to a voltage, shown as $V_{cc}$ in FIG. 2 and which can similarly be implemented.

More generally, the partial current mirrors of FIG. 2 could be arranged in placements other than shown in FIG. 3. For example, the individual current mirrors could still consist of a linear arrangement of transistors, but the different sub-mirrors may not all be collinear. Various generalizations of the common centroid arrangement using the described sub-mirrors are also possible, although in practice the by pitch size may limit the number of feasible possibilities.

The ratios of the various currents can be can be taken in ratios other than $I_0:I_1:I_2: I_k$=1:1:1: . . . :1. This can be done in the standard way of altering the relative dimensions of the transistors in the mirror so that the width to length ratios are no longer equal. Alternately, or in addition, it can be done by changing the relative number of sub-elements into which each element MIR or MBi is subdivided. For example, with all of the transistors manufactured to have the same dimensions, the ratio of currents is set by the ratio of the number of sub-elements composing a given element. Thus if MIR 200 and MB1 210 were each composed of six sub-elements with one each going into six partial current mirrors, while MB2 200 were only composed three elements and present in only three of the partial mirrors, the ratios would be set at $I_0:I_1:I_2:$ . . . =2:2:1: . . . , and so on. Thus, not every partial mirror need contain a sub-element corresponding to each leg of the total current mirror as long as it has at least one of the $MIR_i$. Similarly, each partial mirror may contain more than one sub-element from the mirrored element or the branch elements MBi. The current ratios are then determined by the ratio of the total number of elements summed at the drain lines $DL_0$–$DL_k$ 250–259 to form $I_0$–$I_k$.

One application of the circuit in FIG. 3 is to provide a more accurate current mirror for incorporation into a non-volatile element memory such as was shown in FIG. 1. This could be the sort of multi-level EEPROM or Flash memory device described in U.S. Pat. No. 5,172,338, which was incorporated by reference above in the background section, or a device such as that described in copending U.S. patent application Ser. No. 09/505,555, filed Feb. 17, 2000, by Kevin M. Conley, John S. Mangan, and Jeffery G. Craig, entitled "Flash EEPROM System with Simultaneous Multiple Data Sector Programming and Storage of Physical Block Characteristics in Other Designated Blocks" which is hereby expressly incorporated herein by this reference.

The mirror transistors can be formed along with the memory cells. Their diffusion regions would be formed at the same time as the appropriate diffusion regions in the memory transistors. The control gate would be formed, say, as part of the third poly layer used for control gates in the memory cells and the drain lines formed with the second metal layer. The multi-level memory cells are arranged into sense groups, corresponding to number of cells in a reading unit. These could each consist of, say, 16 cells, with the actual size being a design choice representing a compromise between the complexities of reading more, and the slowness of reading fewer, during a read or verify operation. This pitch for the chosen sense group size then determines the allowable width w within which the mirror transistors should fit. By taking N current mirrors, this allows an effective transistor width of W=Nw, or 5w in the exemplary embodiment, as well as reducing any of the position dependent variations described above.

Various details of the implementation and method are merely illustrative of the invention. It will be understood that various changes in such details may be within the scope of the invention, which is to be limited only by the appended claims.

What is claimed is:

1. A multiple output current mirror in an integrated circuit, comprising:

a first set of N transistors, where N is greater than two, wherein the drain of each transistor of said first set has its drain connected to its gate, and wherein the drains of all N transistors of said first set are connected together to provide a reference current; and a plurality of second sets of N transistors, wherein the drains of all the transistors within a given one of said second sets are connected together to provide a corresponding plurality of currents, wherein the gates of all of said transistors are connected together and the sources of all of said transistors are at the same voltage level, wherein said transistors are physically arranged in the integrated circuit as N partial current mirrors, each comprising one transistor from said first set and one transistor from each of said second sets, wherein the transistors in each of said partial current mirrors are in a linear arrangement, and wherein the transistors in the linear arrangement of each of said partial current mirrors are ordered in a differing permutation.

2. The multiple output current mirror of claim 1, wherein each of said partial current mirrors, the transistor from said first set is centrally located.

3. The multiple output current mirror of claim 1, wherein said partial current mirrors are arranged so that said linear arrangements are collinear.

4. The multiple output current mirror of claim 1, wherein all of said transistors within a given set are manufactured to have the width to length ratio.

5. The multiple output current mirror of claim 4, wherein the number of said second sets is three.

6. The multiple output current mirror of claim 5, wherein N is five.

7. The multiple output current mirror of claim 4, wherein said integrated circuit is a non-volatile memory circuit.

8. The multiple output current mirror of claim 7, wherein said non-volatile memory circuit comprises an array of Flash EEPROM cells.

9. The multiple output current mirror of claim 8, wherein said Flash EEPROM cells are multi-level memory cells.

10. The multiple output current mirror of claim 8, wherein said transistors have a channel width corresponding the pitch of a sense group of said array of Flash EEPROM cells.

* * * * *